United States Patent
Cheng et al.

(10) Patent No.: US 7,223,653 B2
(45) Date of Patent: May 29, 2007

(54) PROCESS FOR FORMING A BURIED PLATE

(75) Inventors: Kangguo Cheng, Beacon, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 305 days.

(21) Appl. No.: 10/710,045

(22) Filed: Jun. 15, 2004

(65) Prior Publication Data

US 2005/0277264 A1 Dec. 15, 2005

(51) Int. Cl.
*H01L 21/8242* (2006.01)

(52) U.S. Cl. ............... 438/243; 438/246; 438/249; 257/E27.092

(58) Field of Classification Search .......... 438/243, 438/246, 249; 257/E27.092
See application file for complete search history.

(56) References Cited

U.S. PATENT DOCUMENTS

| | | | |
|---|---|---|---|
| 4,992,299 A * | 2/1991 | Hochberg et al. | 427/579 |
| 5,871,811 A | 2/1999 | Wang et al. | 427/248.1 |
| 6,001,684 A | 12/1999 | Shen | 438/246 |
| 6,057,216 A | 5/2000 | Economikos et al. | 438/559 |
| 6,218,319 B1 | 4/2001 | Dutron et al. | 438/784 |
| 6,281,068 B1 | 8/2001 | Coronel et al. | 438/243 |
| 6,310,375 B1 * | 10/2001 | Schrems | 257/301 |
| 6,316,310 B1 | 11/2001 | Wensley et al. | 438/249 |
| 6,365,485 B1 | 4/2002 | Shiao et al. | 438/392 |
| 6,544,856 B2 | 4/2003 | Morhard et al. | 438/392 |
| 2005/0051900 A1 * | 3/2005 | Liu et al. | 257/757 |

* cited by examiner

*Primary Examiner*—William M. Brewster
(74) *Attorney, Agent, or Firm*—Steven Capella

(57) ABSTRACT

A method is provided for making a buried plate region in a semiconductor substrate. According to such method, a trench is formed in a semiconductor substrate, the trench having a trench sidewall, the sidewall including an upper portion, and a lower portion disposed below the upper portion. A dopant source layer is formed along the lower portion of the trench sidewall, the dopant source layer not being disposed along the upper portion of the trench sidewall. A layer is formed to cover the upper portion of the trench sidewall. Annealing is then performed to drive a dopant from the dopant source layer into the semiconductor substrate adjacent to the lower portion of the trench sidewall.

15 Claims, 10 Drawing Sheets

PROCESS FOR FORMING A BURIED PLATE

BACKGROUND OF INVENTION

The invention relates to semiconductor processing, and more particularly to an improved method for forming a buried plate such as used in a trench capacitor of an advanced microelectronic device, e.g., a dynamic random access memory (DRAM).

A goal of the semiconductor industry is to increase the circuit density of integrated circuits ("ICs" or "chips"), most often by decreasing the size of individual devices and circuit elements of a chip. Trench capacitors are used in some types of DRAMs for storing data bits. Often, increasing the circuit density of such DRAMs requires reducing the size of the trench capacitor, which, in turn, requires reducing the area of the chip occupied by the trench capacitor. Achieving such reduction in surface area is not straightforward, because different components of the storage capacitor do not scale at the same rate, and some components cannot be scaled below a certain size. It would be desirable to provide a process of forming a trench capacitor which helps maintain the lateral dimensions of the trench capacitor within tolerances at the surface of the chip that are needed to achieve further reductions in size.

The fabrication of a trench capacitor begins by etching an opening in a semiconductor substrate. A trench capacitor is typically formed by a series of process steps, starting by etching a deep trench in a semiconductor region of a substrate. A patterned pad stack is generally provided on the substrate to define a window through which the opening is to be etched.

The trench capacitor is a plate capacitor, having as a first plate a "buried plate", which is a charge-containing region in the semiconductor substrate adjacent to the sidewall of the trench. A second plate of the capacitor is provided as a "node electrode", separated from the buried plate by a thin "node dielectric." The buried plate is typically disposed adjacent to only a lower portion of the trench, while an isolation collar is provided in the upper portion of the trench to isolate the trench capacitor from other nearby devices such as transistors. The buried plate is typically formed by outdiffusion of dopants from a dopant source into the lower portion. Typically, the dopant source is one that provides dopants, such as arsenic-doped silicate oxide, i.e., arsenic-doped glass (ASG). The dopant source is deposited to cover the sidewalls and bottom of the trench, such as through a low-pressure chemical vapor deposition (LPCVD) process. Thereafter, an annealing process is conducted to drive the dopants into the adjacent areas of the substrate to form the buried plate.

Unfortunately, the conventional ASG process to form a buried plate is not ideal. First, the exposed region of the semiconductor substrate adjacent to the upper portion of the trench may be undesirably doped when the dopant source layer is not completely sealed. Second, the exposed region of the semiconductor substrate adjacent to the upper portion of the trench may be undesirably oxidized and widened when the formed oxide is removed. These problems are illustrated with reference to FIG. 1.

FIG. 1 is a cross-sectional view illustrating a stage in the formation of a buried plate for a trench capacitor according to a prior art process. As shown in FIG. 1, a trench 105 is vertically etched into the semiconductor substrate 100 through an opening 115 in a pad stack 130 and through an opening in an overlying hard mask layer (not shown) that is removed after etching the trench. The sidewall 110 of the trench represents the edge of the semiconductor substrate, as stands after first etching the trench 105, before subsequent processes are performed. Illustratively, a layer 112 of ASG is deposited onto the sidewall 110 and bottom 145 of the trench 105 as a source of dopant material for later forming the buried plate. A cap layer 200, typically consisting essentially of undoped silicon dioxide, is then deposited over the ASG layer 112. A fill material (not shown), such as a photoresist material, is then typically deposited and recessed to expose the cap layer 200 and the ASG layer 112 in the upper portion of the trench. The exposed cap layer 200 and the ASG layer 112 are then removed from the upper portion 180 of the trench sidewall 110, while the cap layer 200 and the ASG layer 112 remain in place along the lower portion 170 of the trench sidewall 110, as well as the bottom of the trench 105. The fill material may then be removed from the trench. Hereinafter, references to the trench sidewall 110 and lower portion 170 include the trench bottom 145, as well. As apparent from FIG. 1, after the foregoing processing, the top surface 160 of the ASG layer is exposed, in proximity to the upper portion 180 of the trench sidewall 110. This arrangement adversely affects the results of subsequent annealing to form the buried plate.

Thereafter, the substrate 100 is placed in a chamber containing oxygen and annealed for the purpose of driving the arsenic dopant into the substrate 100 adjacent to the lower portion 170 of the trench sidewall to form a buried plate 102, as shown in FIG. 2. During the annealing, a region 155 of the semiconductor substrate adjacent to the original trench sidewall 110 becomes oxidized, such that the lower portion 170 of the trench sidewall 110 is now at a widened location 130 relative to the original trench sidewall 110. This is a desirable result, because a widened trench along the lower portion 170 results in a larger surface area of the trench capacitor (not shown) to be completed by later processing, such larger surface area directly contributing to higher capacitance.

However, referring to FIG. 2, disadvantageous results occur along the upper portion 180 of the trench sidewall 110 as a byproduct of annealing in the oxygen-containing chamber. Along the upper portion 180, the semiconductor substrate is oxidized in region 150. The oxidized region 150 extends outwardly from the original trench sidewall 110 to a post-oxidation sidewall 140, such region which typically is at least as thick as the oxide region 155, and may be even thicker than oxide region 155. The widening of the upper portion 180 of the trench is undesirable, because it negatively impacts overlay tolerance for subsequent processing. In addition, the exposed top surface 160 of the ASG layer shown in FIG. 1 results in the arsenic dopant outdiffusing during the annealing process into region 190 of the semiconductor substrate 100 in the vicinity of the upper portion 180 of the trench sidewall. The undesired doped region 190 of the substrate is shown in FIG. 2 adjacent to the oxidized region 150, which in turn is disposed along the upper portion 180 of the trench sidewall 110. Doping the semiconductor region 190 disposed along the upper trench portion 180 is undesirable because it increases the leakage current of a transistor to be subsequently formed along the upper trench portion and negatively impacts its performance.

FIG. 3 illustrates a further stage in fabrication, after subsequent processing has been performed to remove the oxidized semiconductor material that has formed in regions 150 and 155 shown in FIG. 2. The trench with widened upper portion 180 is further illustrated in FIG. 3 as an increase in a lateral dimension 310, as measured by the spacing bounded by the post-oxidation trench sidewall 140.

This increased dimension 310 is shown in relation to the original lateral dimension 305 of the trench, as represented by the original location 210 of the trench sidewall.

The two problems of trench widening and diffusion of arsenic into the substrate adjacent to the upper portion of the trench negatively impact the performance of the trench capacitor and subsequently formed transistor, and the ability to maintain process tolerances. Both problems are due to exposure of the semiconductor substrate along the upper portion of the trench sidewall to oxygen and to the dopant source material (e.g., ASG) during annealing. Accordingly, a new processing method is desired to address the foregoing concerns.

SUMMARY OF INVENTION

According to an aspect of the invention, a method is provided for making a buried plate region in a semiconductor substrate. According to such method, a trench is formed in a semiconductor substrate, the trench having a trench sidewall, the sidewall including an upper portion, and a lower portion disposed below the upper portion. A dopant source layer is formed along the lower portion of the trench sidewall, the dopant source layer not being disposed along the upper portion of the trench sidewall. A barrier layer is formed along the upper portion of the trench sidewall. The semiconductor substrate is then annealed to drive a dopant from the dopant source layer into the semiconductor substrate adjacent to the lower portion of the trench sidewall.

According to another aspect of the invention, a method is provided for making a buried plate region in a semiconductor substrate. According to such method, a trench is formed in a semiconductor substrate, the trench having a trench sidewall, the sidewall including an upper portion, and a lower portion disposed below the upper portion. A dopant source layer is formed along the lower portion of the trench sidewall, the dopant source layer not being disposed along the upper portion of the trench sidewall. An epitaxial layer of semiconductor material is grown selectively over the trench sidewall in the region of the upper portion of the trench sidewall. The semiconductor substrate is then annealed to drive a dopant from the dopant source layer into the semiconductor substrate adjacent to the lower portion of the trench sidewall. During such anneal, at least a portion of the thickness of the epitaxial layer is oxidized in the region of the upper portion, while comparatively little or no oxidation of the semiconductor substrate occurs in the region adjacent to the upper portion of the trench.

DETAILED DESCRIPTION

The embodiments of the invention described herein address the problems of the conventional drive-in dopant anneal process of dopant diffusion into the semiconductor material along the upper portion of the trench sidewall and undesired widening of the upper portion of the trench, which impacts overlay tolerance. In an embodiment, a barrier layer is formed on an exposed surface of the semiconductor material along an upper portion of the trench sidewall. During subsequent annealing, the barrier layer protects the upper portion from dopant diffusion and oxidation while a dopant from a dopant source layer, e.g., ASG, is driven into the semiconductor material along a lower portion of the trench sidewall. In another embodiment, an epitaxial layer of semiconductor material is grown selectively onto the sidewall of the trench as a sacrificial layer. In this embodiment, during subsequent annealing to form the buried plate, the sacrificial semiconductor layer is oxidized. However, comparatively little or none of the semiconductor substrate adjacent to the upper portion of the trench is oxidized. In addition, the epitaxial layer also protects the region of the substrate adjacent to the upper portion of the trench sidewall from undesired dopant diffusion during the anneal. The oxidized sacrificial semiconductor layer is thereafter removed, such that the trench has substantially the same or smaller dimension in the region of the upper portion as it did prior to the annealing.

Figure 2:
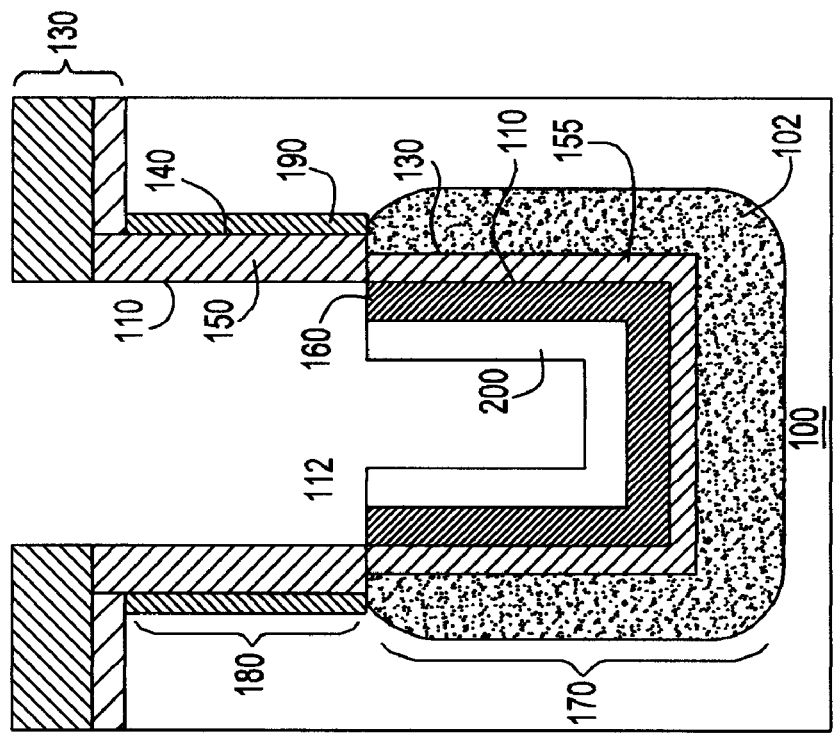
FIGS. 1 through 3 are a cross-sectional views illustrating stages in the formation of a buried plate according to a conventional process.
Figure 1:
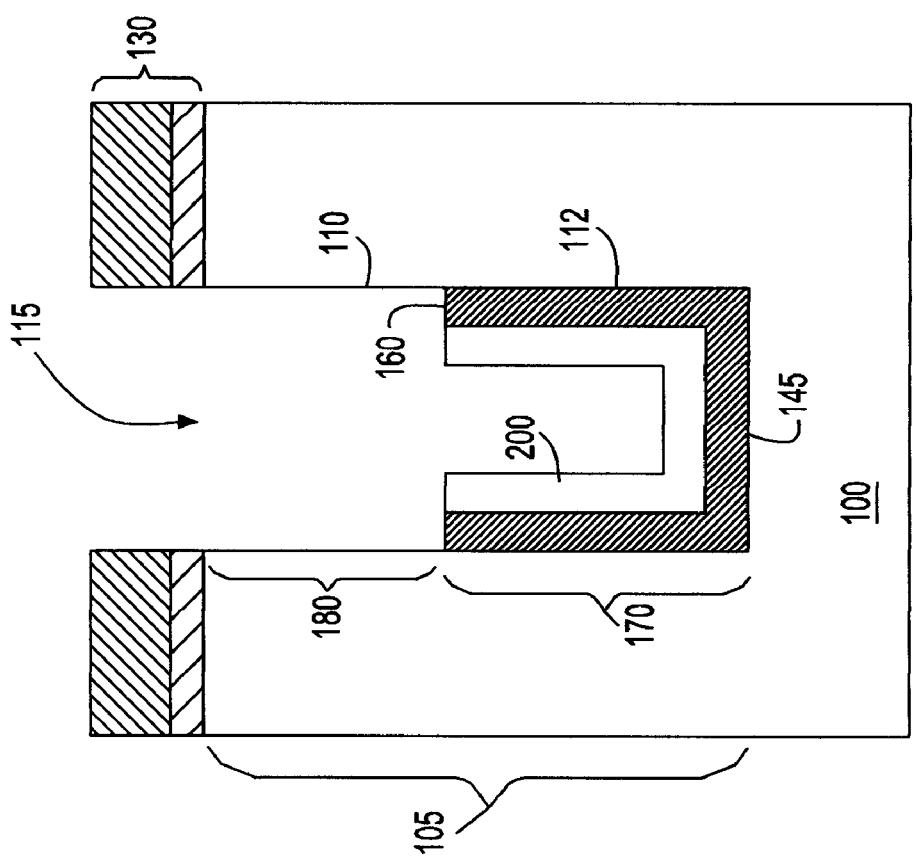
Figures 3, 4:
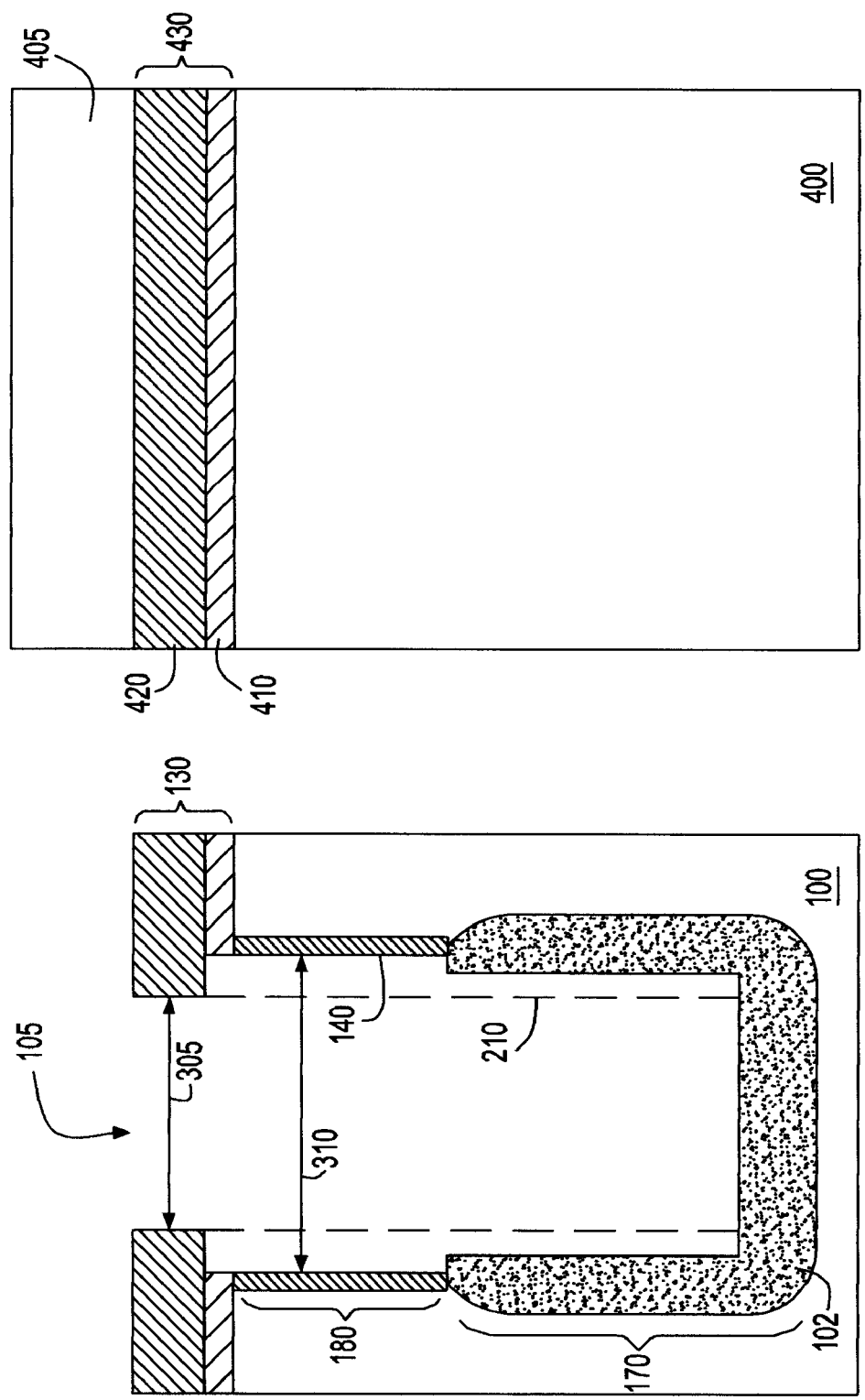
FIGS. 4 through 19 are cross-sectional views illustrating stages in the fabrication of a trench capacitor process according to embodiments of the invention.
Figure 6:
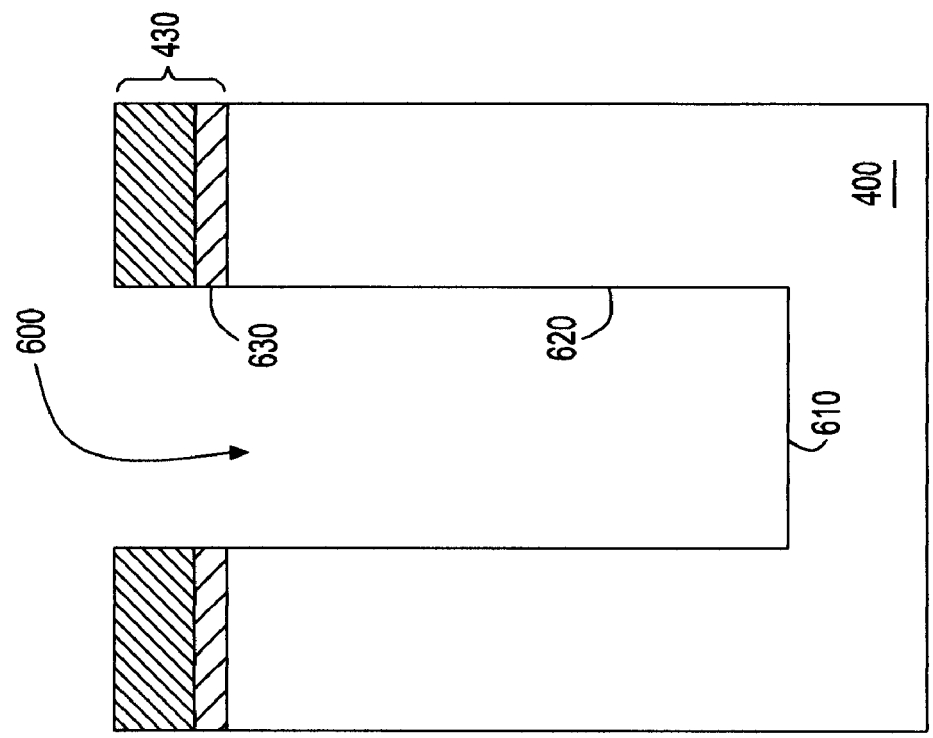
Figure 5:
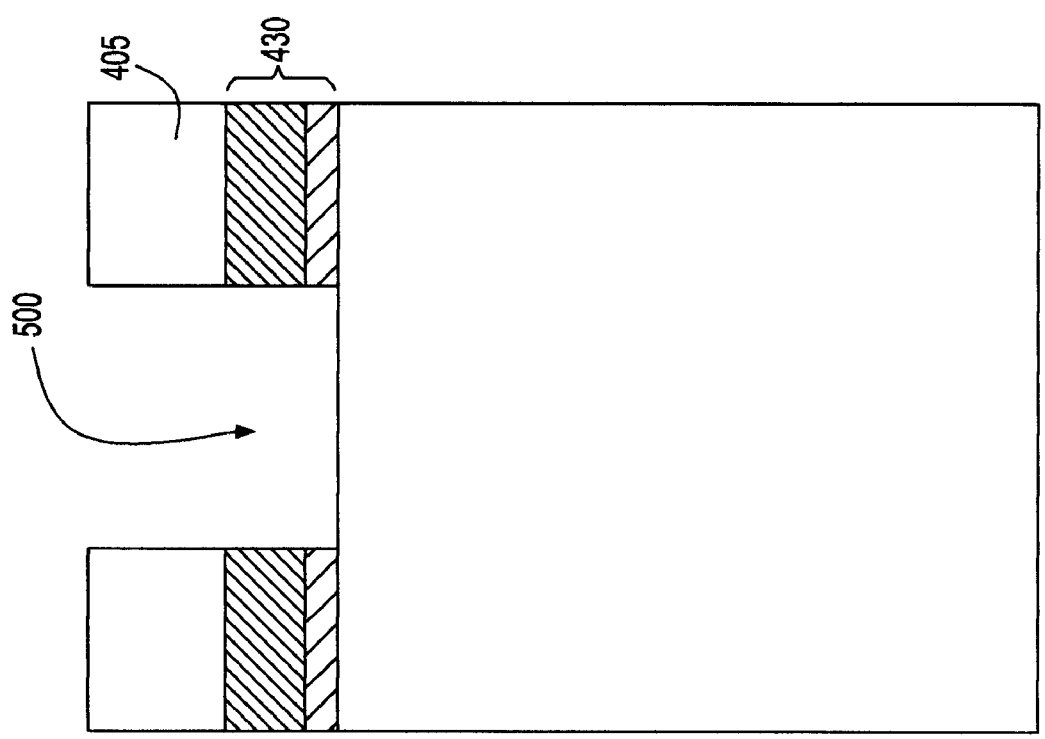

FIGS. 4 through 15 illustrate stages in processing according to an embodiment of the invention. FIGS. 4 through 6 illustrate a process of patterning a trench. Illustratively, in this process, the trench is patterned in a semiconductor substrate 400, which typically consists essentially of p-type doped silicon. Alternatively, the substrate has a semiconductor-on-insulator type structure, e.g., is a silicon-on-insulator (SOI) substrate. Other suitable alternative types of substrates include germanium, silicon germanium, silicon carbide, strained silicon, and those consisting essentially of one or more III-V compound semiconductors having a composition defined by the formula $Al_{X1}Ga_{X2}In_{X3}As_{Y1}P_{Y2}N_{Y3}Sb_{Y4}$ where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

A variety of methods may be utilized to form the deep trench. Typically, a mask layer is first formed and patterned on the substrate, being comprised of a material less susceptible to etching, such as a hardmask layer of silicon oxide and/or silicon nitride or other material. FIG. 4 shows one embodiment in which an oxide layer 405 functions as a hardmask layer, disposed over a pad stack 430 having a nitride layer 420 and an optional oxide layer 410. The oxide layer 410 is preferably provided between the pad nitride layer 420 and the semiconductor substrate 400 as a buffer layer to improve the adhesion of the pad nitride layer 420 and to reduce the interface stress.

As shown in the cross-sectional depiction of FIG. 5, the hardmask layer 405 is patterned and etched to create an opening 500 through which the trench will then be formed in the semiconductor substrate. Patterning can be done by forming a photoresist layer (not shown) and exposing and developing the same by any suitable process such as optical lithography, electron beam lithography, x-ray lithography, and ion beam lithography. The hardmask layer 405, along with the underlying pad stack 430 can then be etched selective to the photoresist using any conventional etch process, for example, reactive ion etch (RIE). The photoresist is stripped after forming opening the hardmask or after opening the hardmask and the underlying pad stack.

Referring to FIG. 6, the substrate 400 then is etched by any suitable process such as RIE to form deep trench 600.

The remaining hardmask layer is stripped after forming the deep trench. The deep trench has a small width, typically ranging from 90 nm to 150 nm according to the current generation of semiconductor devices. The deep trench is etched to a depth ranging between about 2 microns ($\mu m$) and 10 $\mu m$. Etching defines a trench 600 having a sidewall 620, and a bottom 610. In one embodiment as illustrated in FIG. 6, the trench 600 is patterned in a manner that aligns an edge 630 of the pad stack 430 to the sidewall 620 of the trench 600. Hereinafter, references to the trench sidewall in general and to the lower portion of the trench sidewall shall be understood to include the trench bottom 610, as well.

Figure 7:
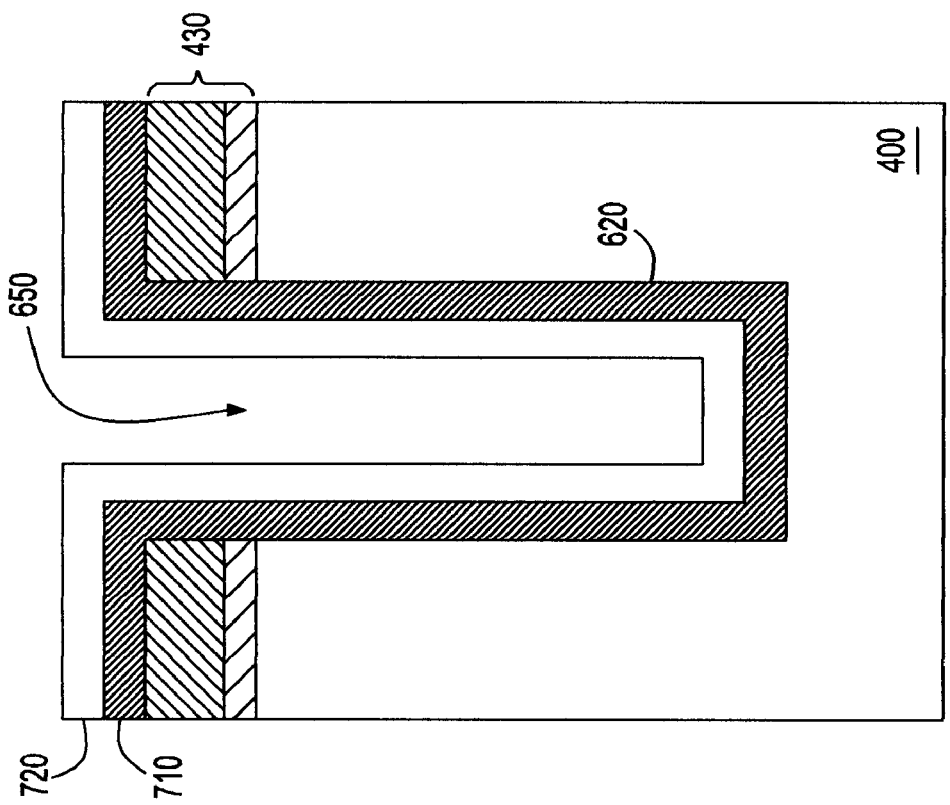

Referring to FIG. 7, a dopant source layer 710 is formed along the trench sidewall 620, followed by deposition of a cap layer 720. The dopant source layer 710 preferably consists essentially of arsenic doped glass (ASG) to provide a dopant for forming an n+ type doped region in a p-type doped semiconductor substrate 400, such as a p-type silicon substrate. The cap layer 720 preferably consists essentially of an undoped oxide, e.g., silicon dioxide, and is preferably formed in situ in the same chamber used to deposit the dopant source layer 710. The cap layer 720 preferably functions as a diffusion barrier to prevent dopant material from escaping from the dopant source layer 710 into the trench opening 650 during the subsequent dopant drive-in anneal. Both the dopant source layer 710 and the cap layer 720 are deposited conformally by a process such as LPCVD (low pressure chemical vapor deposition), CVD (chemical vapor deposition), PECVD (plasma enhanced CVD), or other similar method. Preferably, low-pressure chemical vapor deposition (LPCVD) is used to deposit one or more relatively thin, high quality films. In a preferred embodiment, ASG is deposited as the dopant source layer 710 by LPCVD at 700° C. for about 60 minutes.

Figure 8:
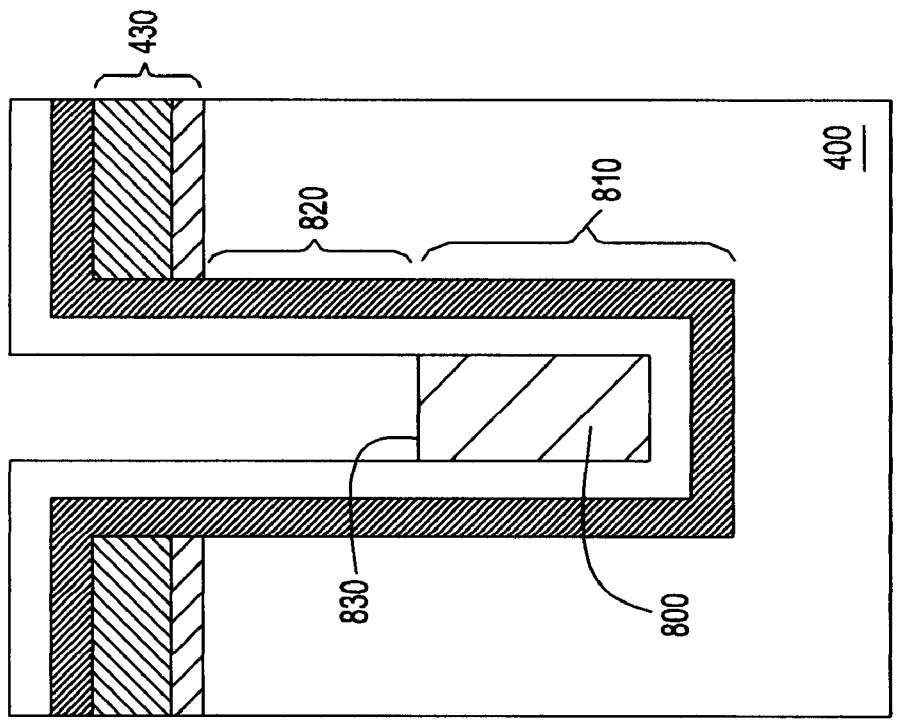

Referring to FIG. 8, after the deposition of the dopant source layer 710 and cap layer 720, a filler material 800, such as a photoresist fill, (hereinafter "resist fill") is deposited in the trench. Thereafter, the resist fill is recessed to a predetermined level 830, as by a timed etch, e.g., a wet etch or RIE, to define an upper portion 820 of the trench sidewall above that level 830 and a lower portion 810 of the trench sidewall below that level. Alternatively, polysilicon can be deposited and recessed to fulfill this function. A capacitor will be formed later along the lower portion 810 of the trench sidewall, while the upper portion 820 of the trench sidewall is reserved for another purpose, such as for the formation of a transistor.

Figure 9:
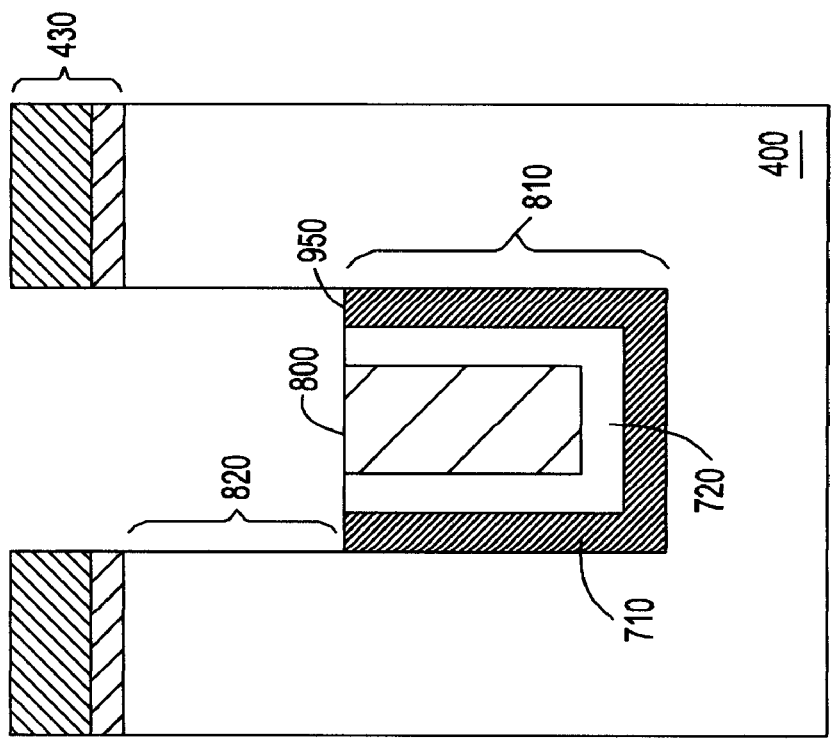

As shown in FIG. 9, the dopant source layer 710, together with the cap layer 720 is removed from the pad stack 430 and the upper portion 820 of the trench sidewall, as by etching selective to silicon and selective to silicon nitride, while the dopant source layer 710 and cap layer 720 remain in place along the lower portion 810, where covered by the resist fill 800. As shown in FIG. 9, this results in exposing a top surface 950 of the dopant source layer 710, while the material of the semiconductor substrate 400 is also exposed along the upper portion 820 of the trench sidewall.

Figure 10:
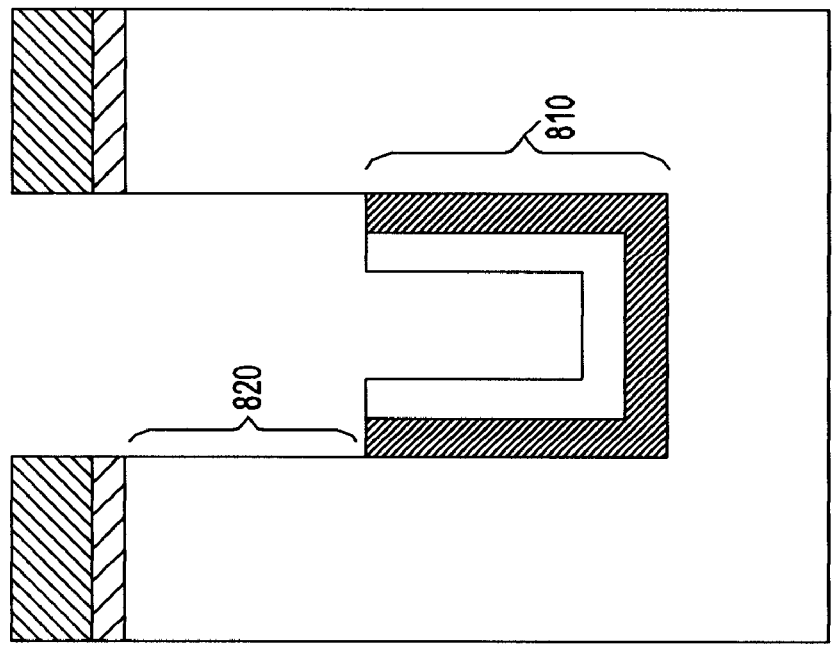

Concern for the possibility of unwanted dopant diffusion along the upper portion 820 during the subsequent anneal is addressed by further processing described below. FIG. 10 illustrates a subsequent stage in which the resist fill is removed from the trench, leaving the dopant source layer 710 and cap layer 720 in place along the lower portion 810 of the trench sidewall.

Figure 11:
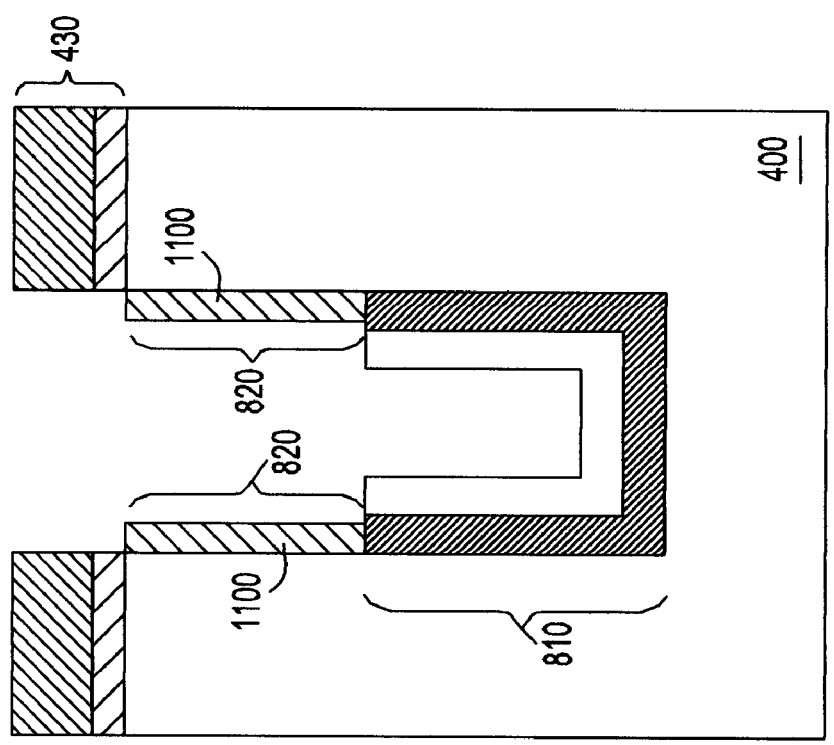

Thereafter, as shown in FIG. 11, an upper barrier layer 1100 is formed along the upper portion 820 as a barrier to dopant diffusion into the semiconductor substrate 400 adjacent to the upper portion 820 during the subsequent dopant drive-in anneal. The upper barrier layer 1100 is preferably provided by local nitridation of the semiconductor material present along the upper portion 820. This nitridation can be performed either in a separate process step or as initial processing integrated into the subsequent dopant drive-in anneal. Alternatively, the upper barrier layer 1100 can be formed by locally forming a silicide along the upper portion 820 when the semiconductor substrate 400 consists essentially of silicon or has substantial silicon content, e.g., such as a substrate having a silicon germanium composition. The process for locally forming the silicide involves depositing a metal in contact with the exposed semiconductor material of the substrate 400 along the upper portion 820 of the trench, annealing to form a silicide, and selectively removing the metal in the remaining areas. For example, when the semiconductor substrate consists essentially of silicon, the formed silicide may be cobalt silicide, nickel silicide, tungsten silicide, titanium silicide, and other suitable silicides. Other alternatives for forming the upper barrier layer include selectively forming a nitride, e.g., titanium nitride, tantalum nitride, and silicon carbide. As a layer 1100 formed by local nitridation of silicon, such silicon nitride layer 1100 has a thickness preferably between about 10 Å (angstroms) and 25 Å. When layer consists essentially of cobalt silicide, nickel silicide, tungsten silicide, titanium silicide, titanium nitride, tantalum nitride, or silicon carbide, it preferably has a thickness between about 20 Å and 200 Å.

Figure 12:
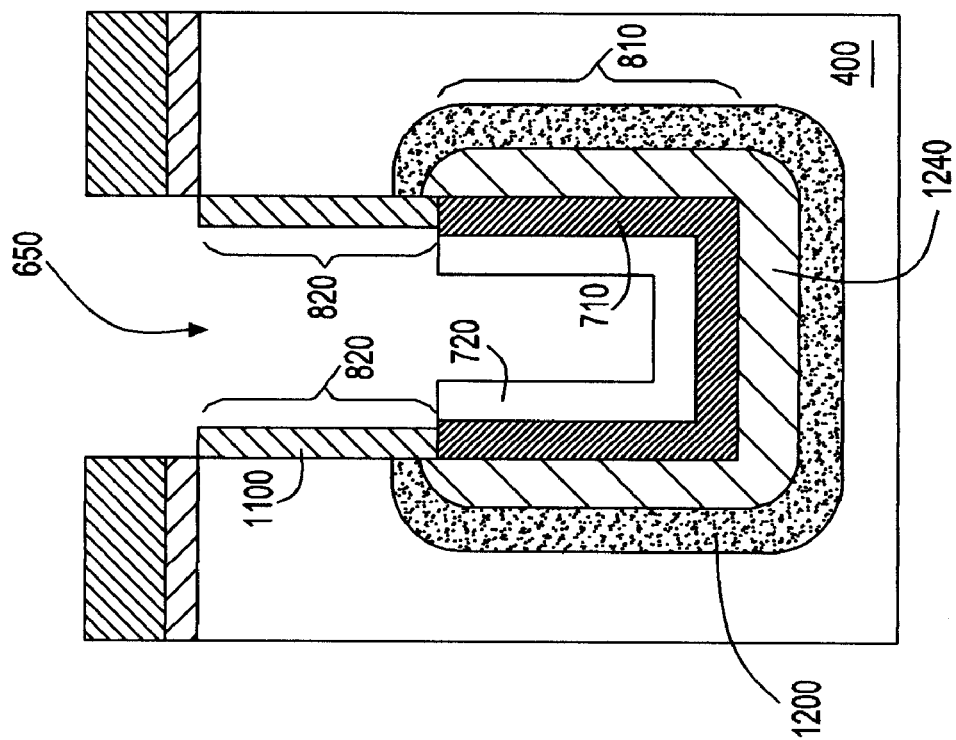

Referring to FIG. 12, with the upper barrier layer 1100 in place, a drive-in anneal is conducted to form the buried plate. The anneal is performed preferably at a temperature between about 900° C. and 1150° C. and preferably at 1050° C. During such anneal, the cap layer 1100 covers the silicon of the substrate 400 adjacent to the upper portion 820 to protect the semiconductor substrate from outdiffusion of arsenic from the dopant source layer 710. As a result of this anneal, the arsenic diffuses into the substrate 400 adjacent to the lower portion 810 to form a heavily doped n+ type semiconductor region as a buried plate 1200. This annealing process preferably includes an aggressive oxidation of the semiconductor material, as well, which results in an oxidized region 1240 adjacent to the lower portion 810. Such oxidized region 1240 will be removed later in order to widen the trench 650 selectively along the lower portion 810, e.g., for the purpose of making a larger size trench capacitor. However, during such oxidation process, the semiconductor substrate along the upper portion 820 is protected from oxidation by the upper barrier layer 1100.

Figure 13:
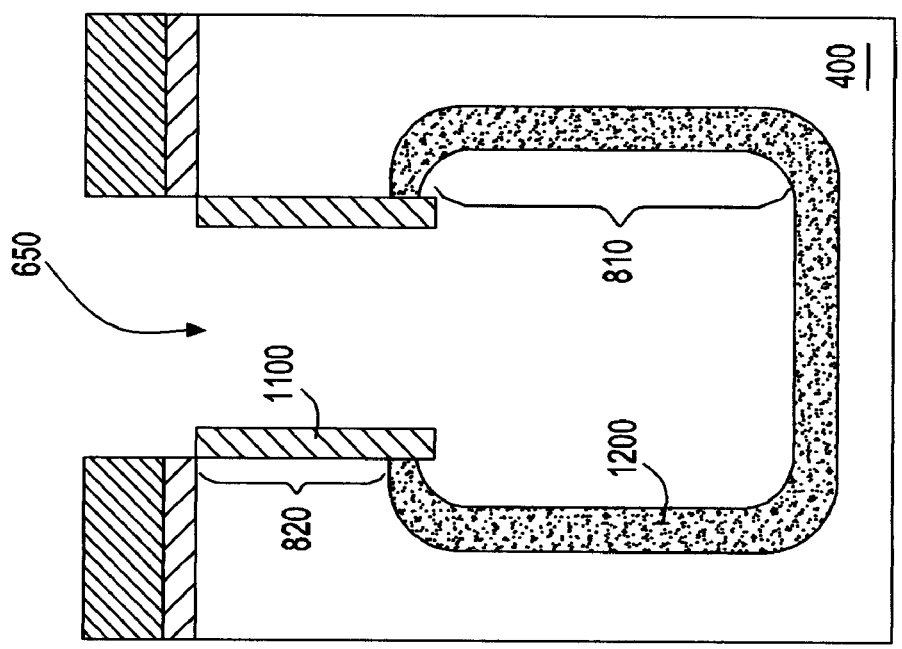

Referring to FIG. 13, after the dopant drive-in anneal, the cap layer, the dopant source layer and the oxidized region are removed from the lower portion 810, leaving the n-type buried plate 1200 in the semiconductor substrate 400 adjacent to the lower portion 810. Such removal is preferably accomplished by an etch process that is selective to the material of the upper barrier layer 1100, such that the semiconductor substrate along the upper portion 820 remains protected during the etch. At this point of processing, little, if any, widening of the trench 650 has occurred along the upper portion 820. The upper portion has been spared from undesired oxidation, and diffusion of dopants therein during the anneal, despite the high temperature and aggressive oxidation conditions under which it has been performed. Otherwise, excessive oxidation of the substrate 400 adjacent to the upper portion might have resulted in undesired widening of the trench after removing the formed oxide. On the other hand, a desirable result of the foregoing process is that the trench 650 in the region of the lower portion 810 has been widened considerably.

Figure 14:
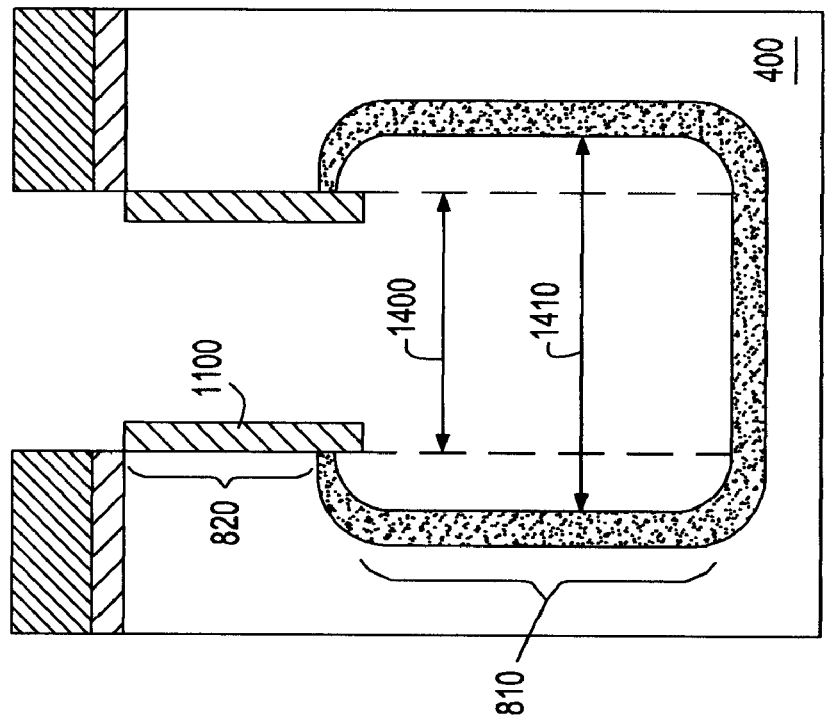

FIG. 14 illustrates results of processing to further widen the trench 650 in the region of the lower portion. Such further widening is preferably performed by isotropic etching of the semiconductor material of the substrate 400. Such etching is preferably performed selective to the material of the upper barrier layer 1100, which remains in place along the upper portion 820 during the etching. At the conclusion of such etching process, the trench 650 has acquired a further widened dimension 1410, which is greater than an original dimension 1400 of the trench 650.

Alternatively, the upper barrier layer 1100 can be removed after the oxidized region is removed, and the lower portion 810 of the trench can then be widened by laterally etching the semiconductor substrate adjacent to the lower portion 810 of the trench sidewall by an etch process which is selective to more lightly doped semiconductor material. Such etch process proceeds more rapidly against the more highly doped semiconductor material adjacent to the lower portion 810 of the trench sidewall after the dopant drive-in anneal has been performed. The result of etching is to produce a widened trench dimension 1410.

Figure 15:
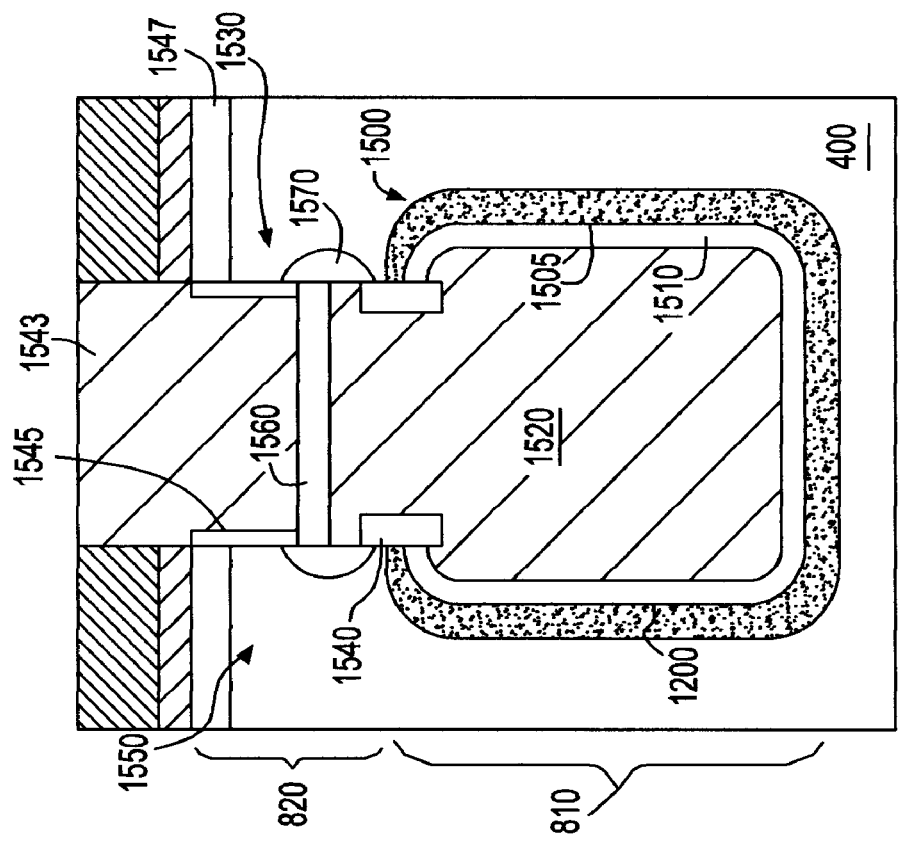

FIG. 15 illustrates a stage of processing after further steps have been performed to complete a trench capacitor 1500 therein and a vertical transistor 1550 disposed above the trench capacitor 1500. As shown in FIG. 15, the trench capacitor 1500 includes the buried plate 1200, a node dielectric 1510 formed on the sidewall 1505 of the silicon where the buried plate 1200 is located, and a node electrode 1520 disposed on the opposite side of the node dielectric 1510 from the buried plate 1200.

The formation of the vertical transistor 1550 along the upper portion 820 of the trench sidewall is only illustrative. Many other structures and ways of forming transistors which connect to the trench capacitor are possible. In the example shown in FIG. 15, the trench capacitor 1500 is separated from the vertical transistor by an isolation collar 1540 formed on a part of the upper portion of the trench sidewall. The vertical transistor includes a gate conductor 1543, a gate dielectric 1545 and a channel region 1530. The channel region 1530 allows current to pass only when the gate conductor 1543 is biased at an appropriate voltage. The gate conductor 1543 is isolated from the node electrode 1520 by a trench top oxide 1560. The vertical transistor 1550 is electrically connected to the node electrode 1520 by an n-type buried strap outdiffusion 1570 formed in the silicon adjacent to the gate dielectric 1545, the trench top oxide 1560 and the node electrode 1520. A drain region 1547 is disposed above the channel region 1530.

Alternatively, instead of a vertical transistor, a planar transistor (not shown) can be formed which connects to the trench capacitor 1500. Alternatively, the trench capacitor 1500 can be connected to circuitry of the chip, such as for use in providing a source of local capacitance, e.g., for decoupling purposes.

Figure 16:
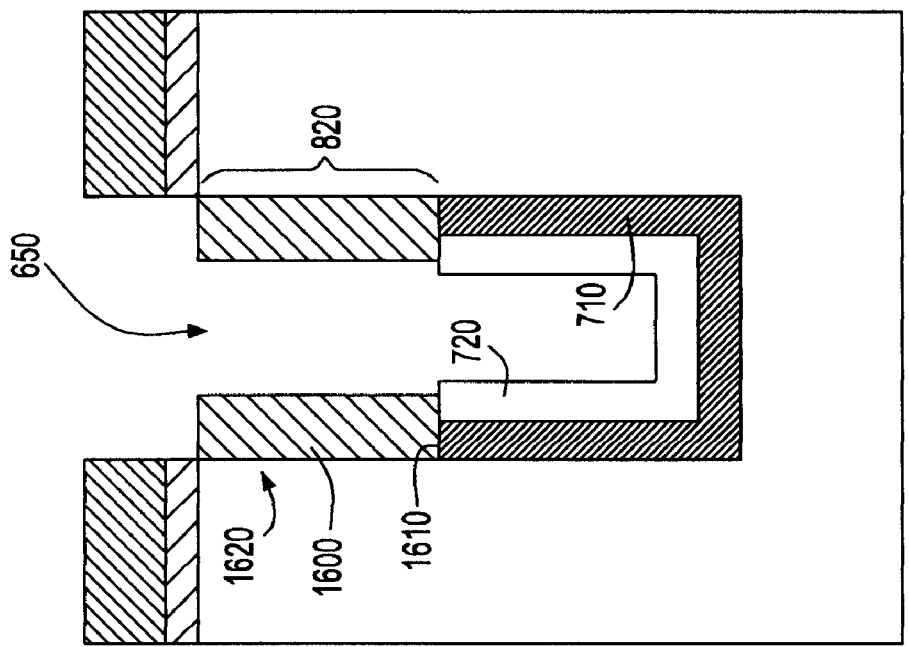

FIGS. 16 through 19 illustrate an alternative embodiment of the invention. In this embodiment, processing begins in the same manner as that shown and described above with respect to FIGS. 4 through 10. Thereafter, instead of forming a barrier layer 1100 as shown in FIG. 11, an epitaxial layer 1600 of semiconductor material is selectively grown on the exposed semiconductor material of the substrate 400 along the upper portion 820 of the trench sidewall, as shown in FIG. 16. The epitaxial layer 1600 preferably consists essentially of the same semiconductor material as the semiconductor substrate 400. Thus, when the semiconductor substrate consists essentially of silicon, an epitaxial layer of silicon is grown selectively onto the single-crystal silicon substrate that is exposed at the upper portion 820 of the trench sidewall. Alternatively, the epitaxial layer may be germanium, silicon germanium, silicon carbide, or silicon germanium carbide. The epitaxial layer 1600 is preferably grown to a sufficient thickness to cover the top surface 1610 of the dopant source layer 710. The epitaxial layer 1600 and the cap layer 720 help to protect the region 1620 of the semiconductor substrate 400 along the upper portion 820 from undesired diffusion of the dopant from out of the dopant source layer 710 into that region during annealing.

Figure 17:
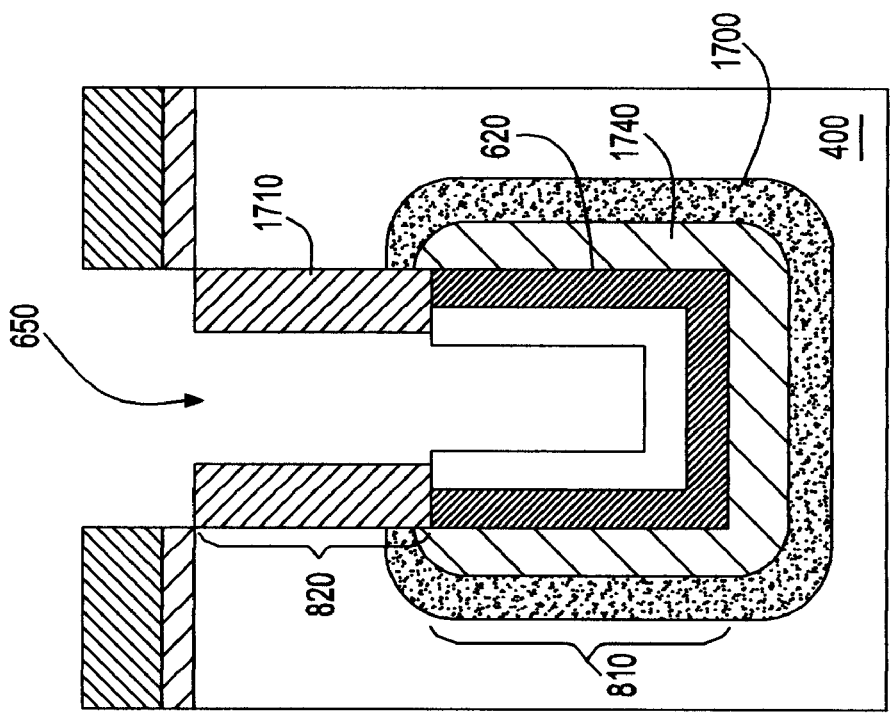

Referring to FIG. 17, after the epitaxial layer 1600 has been formed, a drive-in anneal with aggressive oxidation is conducted to form the buried plate under the same or similar conditions as described above relative to FIG. 12. The results of the anneal are the formation of an oxidized region 1740 adjacent to the lower portion 810 of the trench sidewall 620, and a buried plate region 1700 disposed within the semiconductor substrate 400. A portion of or all of the thickness of the epitaxial layer disposed along the upper portion 820 is oxidized during the anneal to form an oxidized region 1710. The epitaxial layer has thus acted as a buffer layer during the oxidation to protect the upper portion of the trench 650 from widening.

Figure 18:
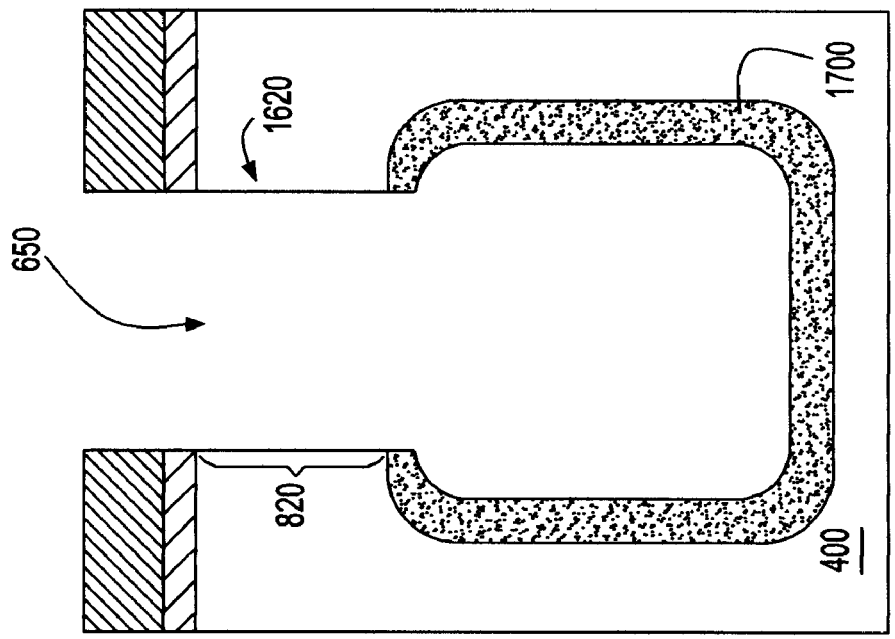

Thereafter, the oxidized regions 1710, 1740, cap layer 720, and dopant source layer 710 (FIG. 16) are removed from the trench 650 by etching selective to the material of the semiconductor substrate 400, resulting in the structure as shown in FIG. 18. After such etch, the buried plate 1700 remains as a feature embedded in the semiconductor substrate 400, disposed to the outside of the trench 650. The upper portion 820 of the trench sidewall remains the same or substantially the same as it was before the anneal, such that the upper portion of the trench 650 has not widened considerably because of the anneal. In addition, little or no dopant diffusion into region 1620 has occurred along the upper portion 820 of the trench sidewall as a result of the anneal. If not all of the epitaxial layer 1600 in FIG. 16 is oxidized and removed, the part of the epitaxial layer that is not oxidized may remain along the upper portion 820 of the trench sidewall, resulting in a even narrower horizontal dimension across the trench than it was before the anneal, such dimension being determined from edges within the trench of the remaining (unoxidized) part of the epitaxial layer 1600.

Figure 19:
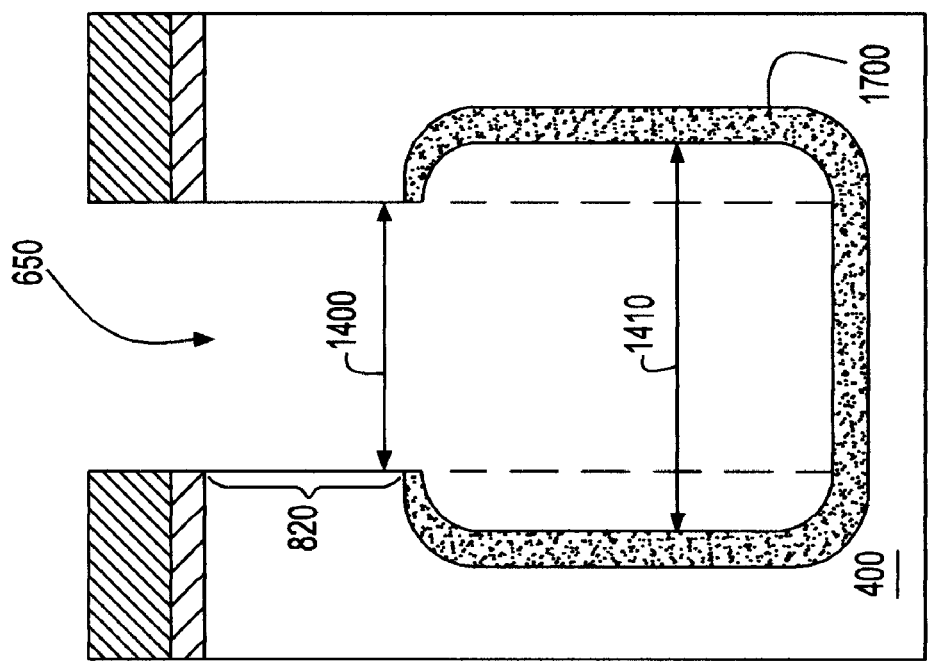

FIG. 19 illustrates results of processing to further widen the trench 650 in the region of the lower portion. Such widening is preferably performed by isotropically etching the n+ doped semiconductor material of the buried plate region 1700 of the substrate 400 selective to the p-type semiconductor material disposed along the upper portion 820 of the trench sidewall. At the conclusion of such etching, the trench 650 has acquired a widened dimension 1410, which is greater than an original dimension 1400 of the trench 650.

In a variation of the above embodiment, when the epitaxial layer consists essentially of a different material from the substrate, for example, when the substrate is silicon and the epitaxial layer is SiGe or SiC, the epitaxial layer can be used as a mask to protect the region of the substrate along the upper portion of the trench sidewall during processing to widen the lower portion of the trench. The differences in processing according to such variation are as follows.

With reference to FIG. 16, an epitaxial layer 1600 consisting essentially of a semiconductor alloy such as silicon germanium (SiGe) or silicon carbide (SiC) which is preferably etch distinguishable from the material of the substrate, e.g., silicon, is grown selectively along the upper portion 820 of the trench sidewall. Thereafter, referring to FIG. 17, the drive-in anneal is performed in a manner which oxidizes the epitaxial layer 1600 only partially, leaving some of the thickness of the epitaxial layer 1600 remaining in contact with the silicon substrate 400 along the upper portion 820 of the trench sidewall. Thereafter, when the oxide layers including the ASG layer, oxide cap and oxidized portion of the epitaxial layer are removed from the trench, as shown in FIG. 18, the unoxidized portion (not shown) of the epitaxial layer remains as a mask along the upper portion 820 of the trench sidewall for protecting the semiconductor substrate 400.

Thereafter, with reference to FIG. 19, the horizontal dimension of the lower portion of the trench is widened to a larger dimension 1410, preferably by a process including etching selective to the unoxidized portion of the SiGe or SiC layer that remains along the upper portion 820 of the trench sidewall. Alternatively, such process need not include etching selective to the unoxidized part of the epitaxial layer. Instead, the unoxidized part may function as a sacrificial layer, of which at least some of its thickness is reduced during the widening of the lower portion of the trench. Thereafter, the unoxidized part of the epitaxial layer can be completely removed from the upper portion 820 of the trench sidewall prior to subsequent processing. Alternatively, all or part of the thickness of the unoxidized part of the epitaxial layer can be allowed to remain for the performance of subsequent processing such as described above with reference to FIG. 15.

Accordingly, the foregoing described embodiments of the invention address challenges of the prior art through use of a barrier layer or sacrificial layer, e.g., epitaxial layer, disposed along an upper portion of a trench to reduce dopant diffusion into the semiconductor material disposed along the upper portion of the trench sidewall and to reduce widening of the upper portion due to unwanted oxidation.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of forming a microelectronic structure including a trench capacitor in a semiconductor substrate, comprising:

forming a trench in a semiconductor substrate, the trench having a trench sidewall, the sidewall including an upper portion, and a lower portion disposed below the upper portion;

forming a dopant source layer along the lower portion of the trench sidewall, the dopant source layer not being disposed along the upper portion of the trench sidewall;

forming a barrier layer along the upper portion of the trench sidewall, the barrier layer having a thickness less than about 25 angstroms; and annealing the semiconductor substrate to drive a dopant from the dopant source layer into the semiconductor substrate adjacent to the lower portion of the trench sidewall to form a buried plate region in the semiconductor substrate adjacent to the lower portion of the trench sidewall;

removing the dopant source layer;

after removing the dopant source layer, forming a node dielectric along the lower portion of the trench sidewall and a node electrode separated from the buried plate region by the node dielectric; and after removing the dopant source layer, forming an isolation collar along at least a part of the upper portion of the trench sidewall.

2. A method as claimed in claim 1, wherein a cap layer is formed overlying the dopant source layer prior to said annealing.

3. A method as claimed in claim 1, wherein the barrier layer is formed by thermal nitridation.

4. A method as claimed in claim 2, wherein the cap layer consists essentially of an undoped oxide.

5. A method as claimed in claim 1, further comprising removing the cap layer and the dopant source layer from the trench sidewall after the annealing, and thereafter removing oxidized material of the substrate to widen the trench in the region of the lower portion.

6. A method as claimed in claim 1, wherein the dopant source layer is formed by depositing arsenic doped glass (ASG) at a temperature of about 700° C.

7. A method as claimed in claim 1, further comprising forming a vertical transistor having a gate conductor overlying the node electrode within the trench.

8. A method as claimed in claim 7, wherein the vertical transistor includes a gate dielectric extending along a part of the upper portion of the trench sidewall above the isolation collar.

9. A method as claimed in claim 1, wherein the barrier layer includes at least one material selected from the group consisting of a metal silicide.

10. A method as claimed in claim 1, wherein the barrier layer includes at least one material selected from the group consisting of a metal nitride.

11. A method as claimed in claim 1, further comprising widening the lower portion prior to forming the node dielectric and prior to forming the node electrode.

12. A method as claimed in claim 11, wherein the lower portion is widened by selective etching after removing the barrier layer.

13. A method of forming a microelectronic structure including a trench capacitor in a semiconductor substrate, comprising:

forming a trench in a semiconductor substrate, the trench having a trench sidewall, the sidewall including an upper portion, and a lower portion disposed below the upper portion;

forming a dopant source layer along the lower portion of the trench sidewall, the dopant source layer not being disposed along the upper portion of the trench sidewall;

forming a barrier layer along the upper portion of the trench sidewall; and annealing the semiconductor substrate to drive a dopant from the dopant source layer into the semiconductor substrate adjacent to the lower portion of the trench sidewall to form a buried plate region in the semiconductor substrate adjacent to the lower portion of the trench sidewall;

removing the barrier layer and the dopant source layer;

after removing the barrier layer and the dopant source layer, forming a node dielectric along the lower portion of the trench sidewall and a node electrode separated from the buried plate region by the node dielectric; and after removing the barrier layer and the dopant source layer, forming an isolation collar along at least a part of the upper portion of the trench sidewall.

14. A method as claimed in claim 13, wherein the barrier layer has a thickness of between about 10 angstroms and 25 angstroms.

15. A method as claimed in claim 13, wherein the barrier layer includes at least one material selected from the group consisting of cobalt silicide, nickel silicide, tungsten silicide, titanium silicide, titanium nitride, tantalum nitride and silicon carbide.

* * * * *